(12) United States Patent
Nagasawa et al.

(10) Patent No.: US 10,283,594 B2
(45) Date of Patent: May 7, 2019

(54) SIC STRUCTURE, SEMICONDUCTOR DEVICE HAVING SIC STRUCTURE, AND PROCESS OF FORMING THE SAME

(71) Applicants: SUMITOMO ELECTRIC INDUSTRIES, LTD., Osaka (JP); TOHOKU UNIVERSITY, Sendai-shi, Miyagi (JP)

(72) Inventors: Hiroyuki Nagasawa, Sendai (JP); Maki Suemitsu, Sendai (JP); Hirokazu Fukidome, Sendai (JP); Yasunori Tateno, Yokohama (JP); Fuminori Mitsuhashi, Itami (JP); Masaya Okada, Itami (JP); Masaki Ueno, Itami (JP)

(73) Assignees: SUMITOMO ELECTRIC INDUSTRIES, LTD., Osaka (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 15/694,478

(22) Filed: Sep. 1, 2017

(65) Prior Publication Data

US 2018/0069081 A1 Mar. 8, 2018

(30) Foreign Application Priority Data

Sep. 2, 2016 (JP) ................. 2016-172296

(51) Int. Cl.
| | | |
|---|---|---|
| H01L 21/02 | (2006.01) | |
| H01L 29/04 | (2006.01) | |
| H01L 29/06 | (2006.01) | |
| H01L 29/16 | (2006.01) | |
| H01L 29/66 | (2006.01) | |
| H01L 29/778 | (2006.01) | |
| H01L 29/786 | (2006.01) | |

(52) U.S. Cl.
CPC ...... *H01L 29/1606* (2013.01); *H01L 21/0243* (2013.01); *H01L 21/0262* (2013.01);
(Continued)

(58) Field of Classification Search
CPC ....... H01L 33/62; H01L 33/486; H01L 33/44; H01L 51/5072; H01L 51/5016
(Continued)

(56) References Cited

U.S. PATENT DOCUMENTS

| | | | | |
|---|---|---|---|---|
| 2011/0006310 A1* | 1/2011 | Nagasawa | ............. | H01L 29/045 257/77 |
| 2011/0143093 A1 | 6/2011 | Kusunoki et al. | | |

(Continued)

FOREIGN PATENT DOCUMENTS

| | | |
|---|---|---|
| JP | 2004-022878 | 1/2004 |
| JP | 2004-152813 | 5/2004 |

(Continued)

*Primary Examiner* — Andy Huynh
(74) *Attorney, Agent, or Firm* — Smith, Gambrell & Russell, LLP.

(57) ABSTRACT

A silicon carbide (SiC) structure and a method of forming the SiC structure are disclosed. The SiC structure includes an SiC substrate and a film provided on the SiC substrate. The SiC substrate contains both of a hexagonal close packed (hcp) structure and a face centered cubic (fcc) structure, and has only one of the hcp surface and the fcc surface, where the hcp surface includes atoms in the topmost layer whose rows overlap with rows of atoms in the third layer, while, the fcc surface includes atoms in the topmost layer whose rows are different from rows of atoms in the third layer.

5 Claims, 14 Drawing Sheets

(52) U.S. Cl.
CPC .. *H01L 21/02107* (2013.01); *H01L 21/02378* (2013.01); *H01L 21/02433* (2013.01); *H01L 21/02447* (2013.01); *H01L 21/02527* (2013.01); *H01L 21/02529* (2013.01); *H01L 21/02612* (2013.01); *H01L 21/02617* (2013.01); *H01L 29/04* (2013.01); *H01L 29/0657* (2013.01); *H01L 29/66045* (2013.01); *H01L 29/7781* (2013.01); *H01L 29/786* (2013.01); *H01L 29/78684* (2013.01); *H01L 21/02658* (2013.01)

(58) Field of Classification Search
USPC ....................................................... 257/29, 77
See application file for complete search history.

(56) References Cited

U.S. PATENT DOCUMENTS

| | | |
|---|---|---|
| 2012/0145070 A1 | 6/2012 | Kusunoki et al. |
| 2012/0196074 A1* | 8/2012 | Ago ................... B82Y 30/00 428/64.1 |
| 2012/0241767 A1* | 9/2012 | Yano .................. H01L 21/049 257/77 |
| 2013/0126865 A1 | 5/2013 | Chiang et al. |
| 2014/0217422 A1 | 8/2014 | Mine et al. |

FOREIGN PATENT DOCUMENTS

| | | |
|---|---|---|
| JP | 2013-510071 | 3/2013 |
| JP | 2013/180930 | 9/2013 |
| JP | 2013-197167 | 9/2013 |
| JP | 2014-152051 | 8/2014 |
| JP | 2014-162683 | 9/2014 |
| JP | 2014-240173 | 12/2014 |
| JP | 2015-110485 | 6/2015 |
| WO | 2009-063844 | 5/2009 |
| WO | 2010-023934 | 3/2010 |
| WO | 2011-074237 | 6/2011 |
| WO | 2013-125669 | 8/2013 |
| WO | 2013-145023 | 10/2013 |

* cited by examiner before H₂ treatment
Ra = 11.48 nm after H₂ treatment
Ra = 0.416 nm

Fig. 14A without H2 treatment 500 µm☐
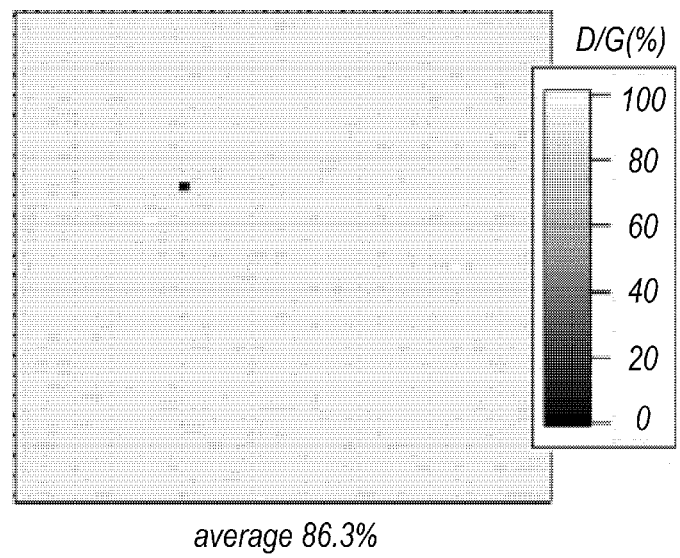
average 86.3%
Fig. 14B with H2 treatment 500 µm☐
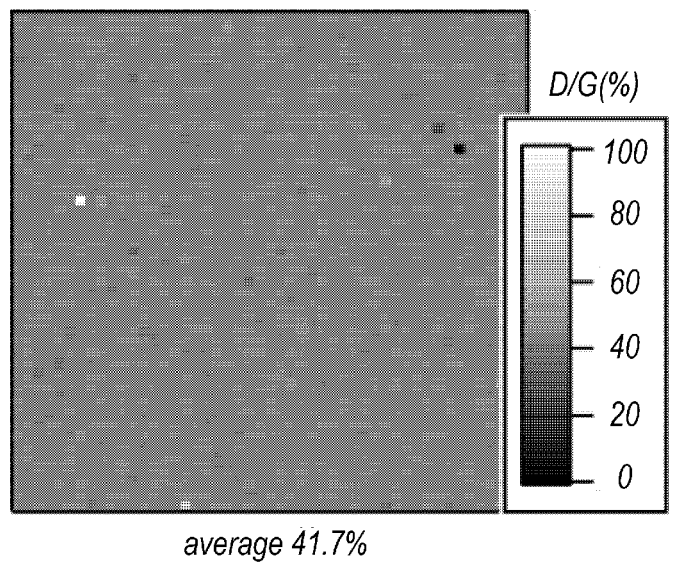
average 41.7%

SIC STRUCTURE, SEMICONDUCTOR DEVICE HAVING SIC STRUCTURE, AND PROCESS OF FORMING THE SAME

BACKGROUND OF THE INVENTION

1. Field of the Invention

The present invention relates to a silicon carbide (SiC) structure, a method of forming the SiC structure, in particular, the invention relates to a single crystal SiC structure, a method of the single crystal SiC structure, and an electronic device having the single crystal SiC structure.

2. Background Arts

An electronic device implementing an SiC substrate has been drawn attention because of not only excellent breakdown voltage but also higher operable frequencies thereof. For instance, an electronic device operable at higher temperatures, having excellent breakdown voltages and losses in higher frequencies is realizable by using a channel made of silicon carbide (SiC) like an SiC-MOSFET (SiC metal-oxide-semiconductor filed effect transistor). Also, an electronic device with a graphene layer on the SiC substrate may be operable at higher frequencies.

A Japanese Patent Application laid open No. of JP-2004-022878A has disclosed an SiC-MOSFET having (000-1) crystal plane as a primary surface thereof in order to enhance carrier mobility in a channel. An international Patent Applications laid open No. WO2009/063844 has disclosed an SiC substrate with an non-polar surface macroscopically but with a composite surface having a non-polar surface and a polar surface in which one of Si-polar surface and C-polar surface dominate. Another international patent application laid open No. WO2011/074237 has disclosed a technique to reduce defects formed at an interface between an SiC substrate and an insulating film by adding phosphorous (P) in the insulating film. Still another international patent application laid open No. WO2013/145023 has disclosed a technique to suppress variation in a threshold voltage of an FET by providing a laminated insulating film having a charge capturing function as the gate insulating film.

A Japanese Patent Application laid open No. JP-2004-152813A has disclosed a device, which has a layer made of an SiC film of 3C-SiC type on an SiC substrate having a 6H-SiC type, which is operable in a high frequency by localizing electrons within the layer of 3C-SiC type. A Japanese Patent Application laid open No. JP-2013-197167A has disclosed a technique of forming a gate insulating film made of 3C-SiC type on an SiC substrate of 4H-SiC type. A conference report of Solid State Devices and Materials, Tokyo (1987) has disclosed a technique often called as the step controlling epitaxy where a lateral growth on a surface of an SiC substrate offset from a closest packed surface is carried out.

A document of Nature Materials volume 8, pages 171 and 172 (2009) has disclosed a technique for growing a graphene layer on an SiC substrate by raising a temperature of the SiC substrate higher than 1100° C. by reducing the SiC substrate. An international patent application laid open No. WO2010/023934 has disclosed another technique for forming a graphene layer on an SiC substrate by exposing Si surface of the SiC substrate by removing a native oxide layer of the SiC substrate, oxidizing Si surface to form $SiO_2$ layer, and heating the SiC substrate within a vacuum. A Japanese patent application laid open No. JP-2015-110485A and an international patent application laid open No. WO2013/125669 each have disclosed a technique to form a graphene layer by heating an SiC substrate within an inactive atmosphere to vaporize Si atoms. A Japanese patent application laid open No. JP-2013-510071A has disclosed a technique of hydrogenating a graphene layer.

A Japanese patent application laid open No. JP-2014-162683A has disclosed a technique of removing hydrocarbons in a graphene layer by forming a carbon buffer layer on an SiC substrate by heating the SiC substrate, decomposing bonds between Si atoms in the SiC substrate and the carbon buffer by exposing the carbon buffer in hydrogen ($H_2$) atmosphere, terminating Si bonds in the SiC substrate by hydrogen ($H_2$), and heating the SiC substrate in a vacuum. A Japanese patent application laid open No. JP-2014-152051A has disclosed a technique of forming a graphene layer by removing native oxide on the surface of an SiC substrate to expose the C-polar surface of the SiC substrate, forming an SiC layer on the C-polar surface of the substrate, and heating the SiC substrate in argon (Ar) atmosphere. A Japanese patent application laid open No. JP-2013-180930A has disclosed a technique of forming a graphene layer by segregating carbon (C) atoms between an SiC substrate and an $SiO_2$ film covering the SiC substrate to form a state where excess carbons are on the SiC substrate, and heating the SiC substrate at a temperature so as not to sublimate Si atoms. A Japanese patent application laid open No. JP-2014-240173A has disclosed a technique of forming a graphene layer by forming an SiC layer on a Si substrate, and heat-treating a surface of the SiC layer by using hydrogen ($H_2$).

Thus, various trials and experiments have been carried out for enhancing the carrier mobility and reducing defects in an SiC-MOSFET. Also, various techniques have been proposed for forming a graphene layer having less defects and superior quality on an SiC substrate. However, no reports have seemed to be proposed how the SiC substrate has a preferable surface structure when a single crystal SiC substrate forms a film thereon.

SUMMARY OF INVENTION

One aspect of the present invention relates to a silicon carbide (SiC) structure that includes an SiC single crystal substrate and a film provided on the SiC substrate. The SiC single crystal substrate includes both of a hexagonal close packed (hcp) structure and a face centered cubic (fcc) structure. A feature of the SiC structure of the present invention is that the surface of the SiC single crystal substrate exposes only one of an hcp surface and an fcc surface, where the hcp surface includes atoms in the topmost layer whose rows overlaps with rows of atoms in a third layer, while, the fcc surface includes atoms in the topmost layer whose rows are difference from rows of atoms in the third layer.

Another aspect of the present invention relates to a process of forming an SiC structure that includes an SiC single crystal substrate that has both of the hcp structure and the fcc structure. The process includes steps of: (i) exposing one of an hcp surface and an fcc surface on a surface of the SiC substrate, where the hcp surface includes atoms in a topmost layer whose rows overlap with rows of atoms in a third layer, while the fcc surface includes atoms in the topmost layer whose rows are different from rows of atoms in the third layer. (ii) forming a film on the surface of the SiC substrate that exposes only one of the hcp surface and the fcc surface.

BRIEF DESCRIPTION OF THE DRAWINGS

The foregoing and other purposes, aspects and advantages will be better understood from the following detailed description of a preferred embodiment of the invention with reference to the drawings, in which:

FIGS. 14A and 14B show maps of a ratio D/G each corresponding to peaks of the Raman scattering spectroscopy where D corresponds to an imperfect six-members ring of carbon atoms and G corresponds to the six-members ring.

DESCRIPTION OF EMBODIMENT

Next, some examples according to the present invention will be described in referring to drawings. In the description of the drawings, numerals or symbols same with or similar to each other will refer to elements same with or similar to each other without overlapping explanations.

The SiC single crystal alternately stacks the hexagonal close packed (hcp) structure and the face centered cubic (fcc) structure along the crystal orientation of [0001]. Depending on the combination of the stacked structures, the SiC single crystal has more than 250 poly-types. Thus, the SiC single crystal substrate exposes the hcp structure or the fcc structure in a (0001) or a (000-1) crystal plane. The specification below calls a surface that exposes the hcp structure a hcp surface, while, a surface that exposes the fcc structure is called a fcc surface. Details of the hcp surface and the fcc surface will be explained later in the specification.

Many documents have been reported about a surface of the SiC single crystal substrate terminated by silicon atoms or carbon atoms. However, which structures are exposed in the surface of the SiC single crystal substrate, the fcc surface or the hcp surface, has seemed to be not reported as far as inventors know.

Figure 1:
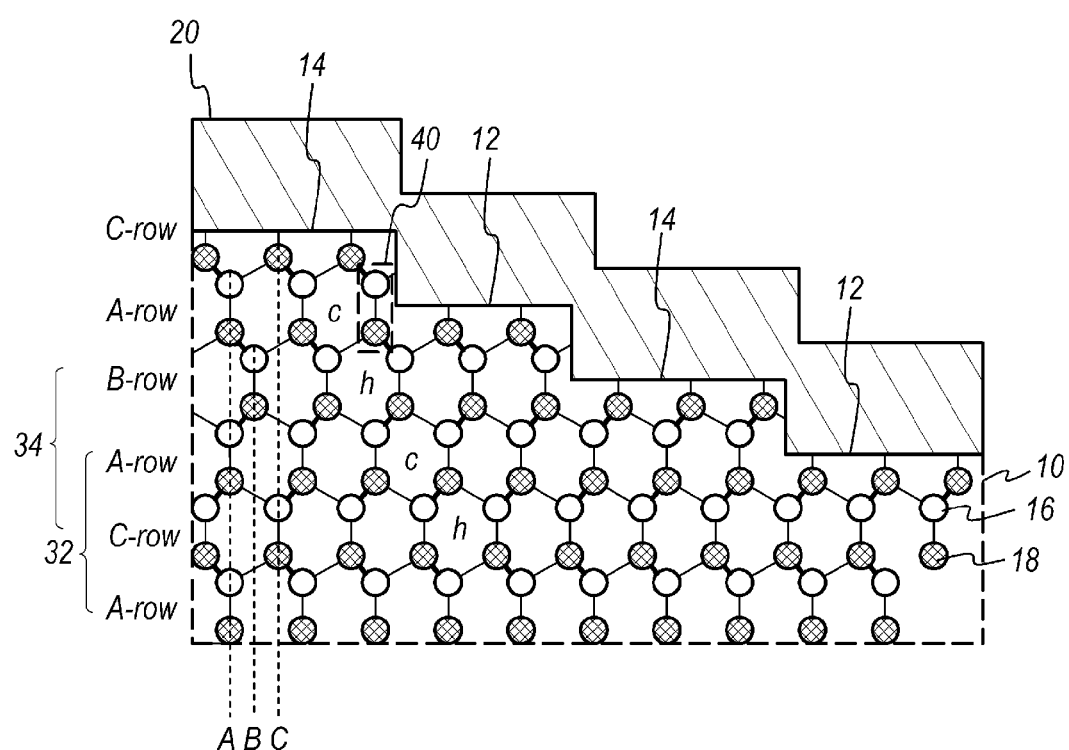
FIG. 1 schematically shows a silicon carbide (SiC) structure having a substrate of 4H-SiC type.

FIG. 1 shows a cross section of an SiC single crystal substrate viewed from a (11-20) plane, where the SiC single crystal substrate has a primary surface of a (0001) crystal plane. The SiC single crystal substrate 10 provides a film 20 thereon. The SiC substrate 10 has a bond connecting a carbon (C) atom 16 with a silicon (Si) atom 18. The 4H-SiC type alternately stacks h-sites (hexagonal site) and c-sites (cubic site) denoted as the bond 40 between carbon atom (C) and silicon atom (Si) within a rectangle surrounded by a broken line.

Details of the h-sites and the c-sites will be further specifically described. Referring to FIG. 1, which is the 4H type, three rows, A to C, are found for the bond 40. The topmost bond 40, where only Si atoms are indicated, exists in the C row, the second topmost bond exists in the A row, the third topmost bond exists in the B row, and the fourth topmost bond exists in the A row. The fifth topmost bond and subsequent bonds iterate this turn of the rows, C-A-B-A-C-A- . . . . That is, the c-sites provide only the A-row, while the h-sites provide the B-row and the C-row alternately appears as sandwiching the A-rows.

The h-sites, that is, a site sandwiched by two sites having the same type, are called as the hexagonal close packed (hcp) stack 32. On the other hand, the c-site accompanied with two sites sandwiching the c-site and having the types different from each other and also different from the c-site, for example, the first A-row sandwiched by the C-row in the upper side and the B-row in the lower side, or the second appearing A-site sandwiched by the B-row in the upper side and the C-row in the lower side thereof, are collectively called as the face centered cubic (fcc) stack 34.

In the hcp surface 12, the topmost Si atom 18 in the row thereof overlaps with the row of the Si atom 18 in the third topmost layer. For instance, the Si atoms 18 in the topmost layer in the hcp surface 12 position in the A-row, the Si atoms 18 in the second one position in the B-row, and the Si atoms 18 in the third one also exist in the A-row. On the other hand, in the fcc surface 14, the topmost Si atoms in the rows thereof are different from the rows of the Si atoms 18 in the third topmost layer. For instance, in the fcc surface 14, the topmost Si atoms 18 exist in the C-row, the Si atoms 18 in the second topmost layer exist in the A-row, and the Si atoms 18 in the third topmost layer exist in the B-row. When atoms existing in the topmost layer are carbon (C), that is, when the surface is the C-polar surface, the positional relations of the C atoms 16 show the relationship same with those for the Si atoms 18. The hcp surface 12 and the fcc surface 14 both become the closest packed surface. It is hard or almost impossible for the whole surface of the SiC substrate 10 to be flat within a range of one atom. The surface of the SiC substrate 10 inevitably shows steps accompanied with the hcp surfaces 12 and the fcc surfaces. The film 20 provided on the surface of the SiC substrate 10 is in contact with both of the hcp surface 12 and the fcc surface 14.

Because the fcc stack 34 shows an inversion symmetry, while, the hcp stack 32 shows no inversion symmetry; the hcp stack 32 causes a spontaneous polarization but the fcc stack 34 causes no spontaneous polarization. This means that charge density on the hcp surface 12 becomes different from the charge density on the fcc surface 14. Inhomogeneous charge density results in non-uniform distribution in electric fields, which causes a non-uniform Schottky barrier height, local variation in the threshold voltage of a MOS-FET, and/or reduction of carrier mobility because of increased scattering of the carrier in the channel of the MOS FET or in an active layer grown on the SiC substrate.

Figure 2:
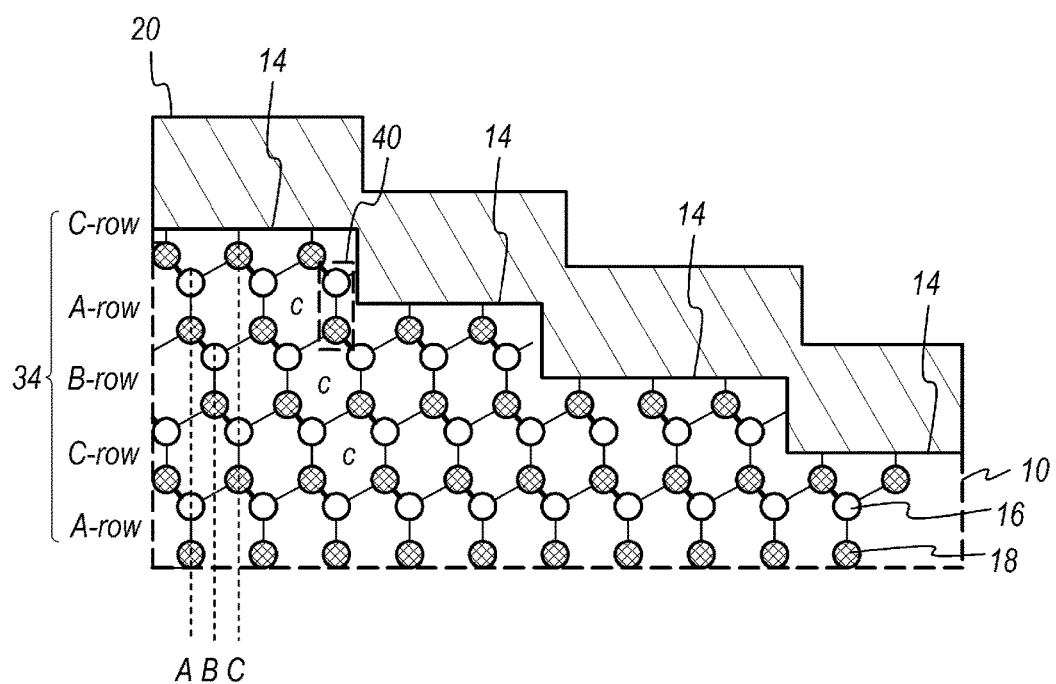
FIG. 2 schematically shows a cross section of an SiC structure having a substrate of 3C-SiC type.

One of types of the SiC single crystal often denoted as 3C-SiC type may realize a structure where the film 20 is in contact with only the fcc surface 14. FIG. 2 shows a cross section of an SiC structure having the 3C-SiC type. The SiC single crystal substrate 10 provides, from the topmost surface thereof, C-row, A-row, B-row, C-row, and so on. That is, 3C-SiC type has a structure iterating three (3) rows, A, B and C, thereby becomes the fcc stack 34. The first numeral "3" means the iteration of rows is three, while, the second appearing symbol "C" means the fcc stack 34.

Figure 3:
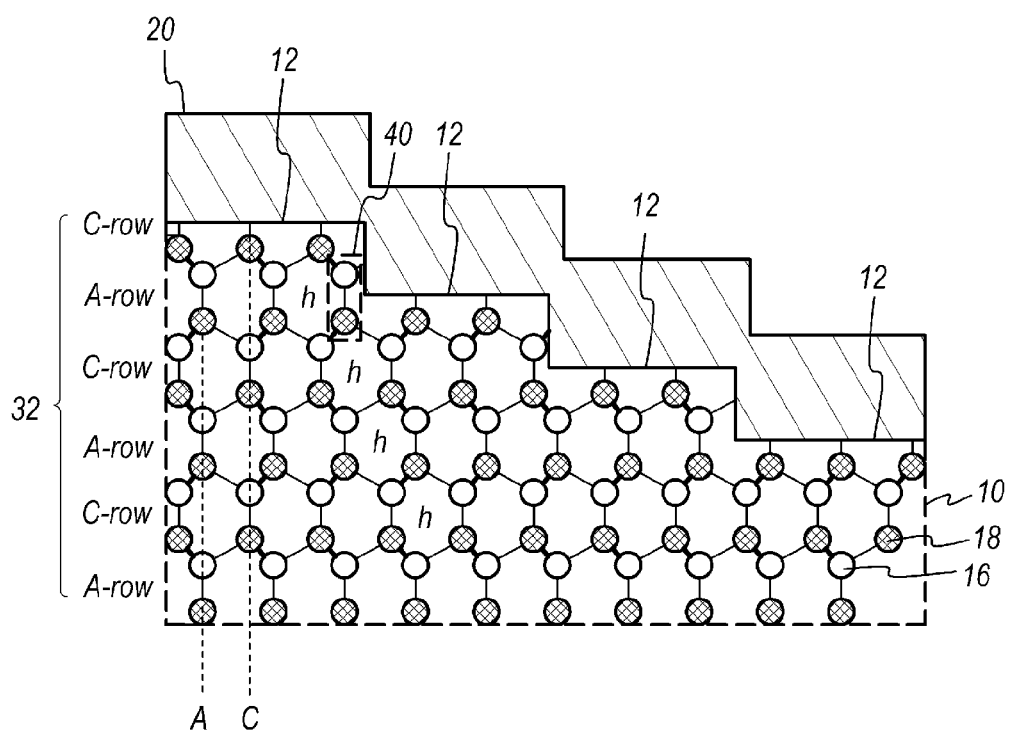
FIG. 3 schematically shows a cross section of an SiC structure having a substrate of 2H-SiC type.

Another type denoted as the 2H-SiC provides only the hcp surface 12 shown in FIG. 3 where the 2H-SiC type iterates two rows, A and C, and has the hcp stack 32. The first appearing symbol "2" means the iteration of two rows, while, the second appearing symbol "H" means the hcp structure. The film 20 may be in contact with only one type of the surface, namely, the hcp surface 12.

However, the former type, 3C-SiC, shows relatively smaller bandgap energy, accordingly, it is inadequate for forming a device with a high breakdown voltage and also for an application where a substrate with high resistivity is required. Also, the latter type, 2H-SiC, is hard to produce with enough reproducibility. A SiC substrate with types of 4H-SiC and 6H-SiC are preferably available in the field; but these types stack the h-sites and the c-sites by a predetermined order. In such types, it is hard or impossible to get the topmost surface flat enough within one atomic range and have only one type.

The present invention provides an SiC substrate with a film provided thereon, where the SiC substrate has only one type, the fcc surface or the hcp surface, but has substantial steps.

Next, embodiment of the present invention will be described.

First Embodiment

Figure 4:
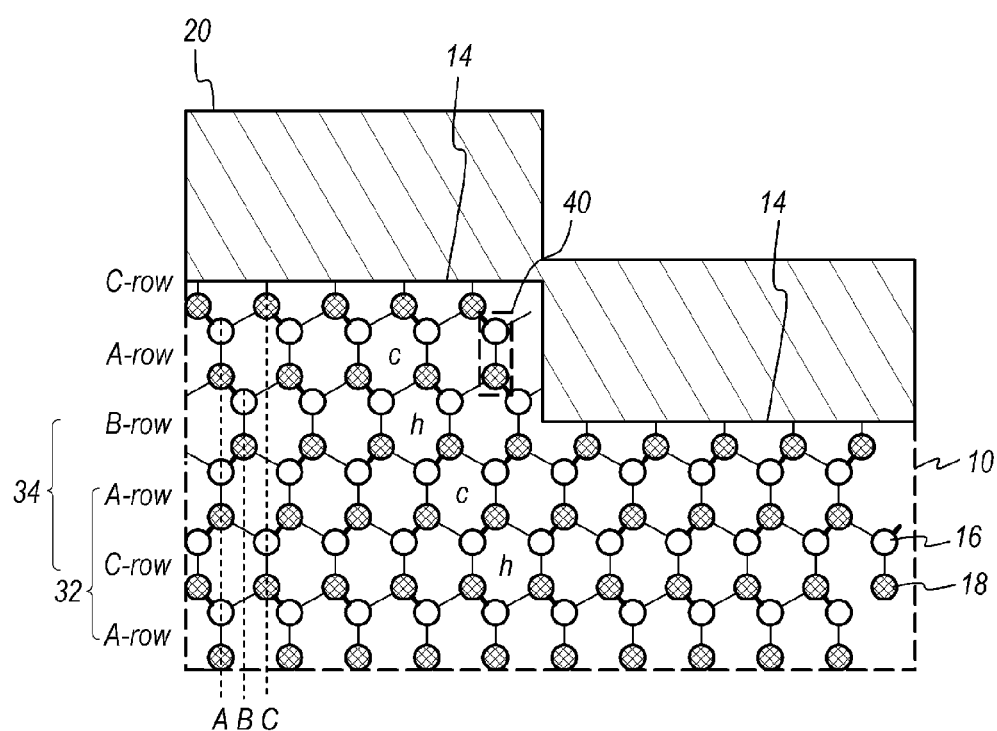
FIG. 4 schematically shows a cross section of an SiC structure having a substrate of 4H-SiC type whose surface exposes an fcc surface.

FIG. 4 shows a cross section of an SiC structure according to the first embodiment of the present invention where the SiC substrate has a symmetry of 4H and an fcc surface. As shown in FIG. 4, the first embodiment provides a film 20 on the (0001) surface of the substrate made of SiC single crystal. The order of the sites in the SiC single crystal substrate 10 is same with that shown in FIG. 1, where the c-site and the h-site are arranged alternately. Steps appear in every two sites. The surface of the SiC substrates 10 appears the fcc surface 14 and the film 20 is in contact with the fcc surface 14 but apart from the hcp surface 12. Other arrangements are substantially same with those shown in FIG. 1.

Figure 5:
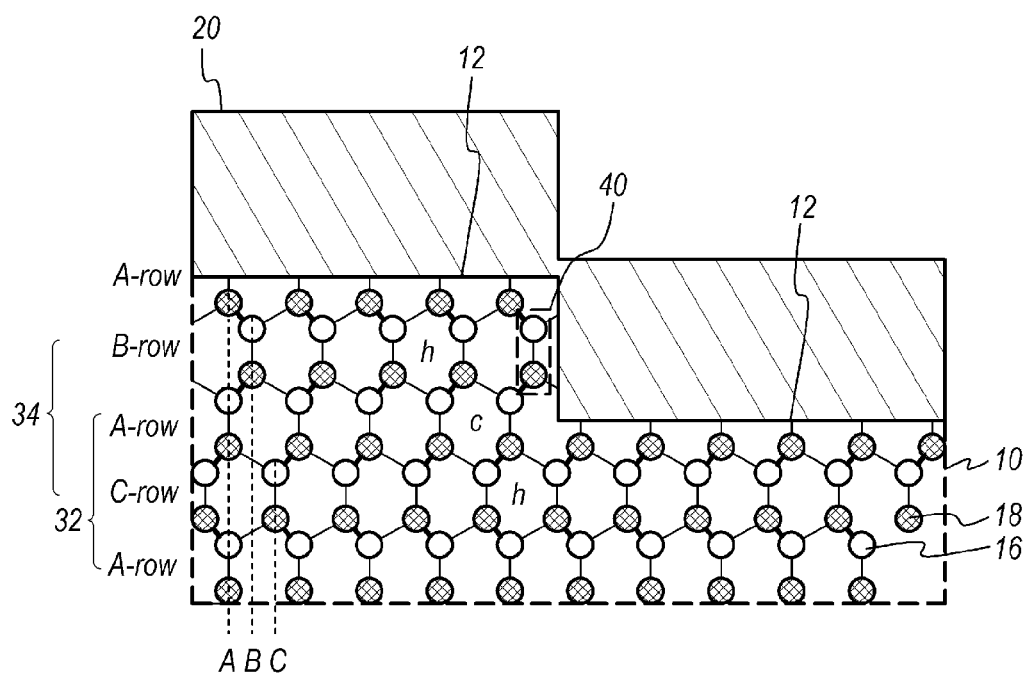
FIG. 5 schematically shows a cross section of an SiC structure having a substrate of 4H-SiC type whose surface exposes an hcp surface.

FIG. 5 shows a cross section of another SiC structure of the 4H-SiC type with the hcp surface according to the first embodiment of the present invention. The SiC structure shown in FIG. 5 has steps in every two atomic layers. The surface 10 of the SiC substrate has the hcp surface 12, and the film 20 is in contact with the hcp surface 12 but apart from the fcc surface 14. Other arrangements of the SiC structure shown in FIG. 5 are substantially same with those shown in FIG. 4. As shown in FIGS. 4 and 5, the 4H-SiC substrate may select the fcc surface 14 and the hcp surface 12 by forming the steps in every two atomic layers or every even number of atomic layers.

Figure 6:
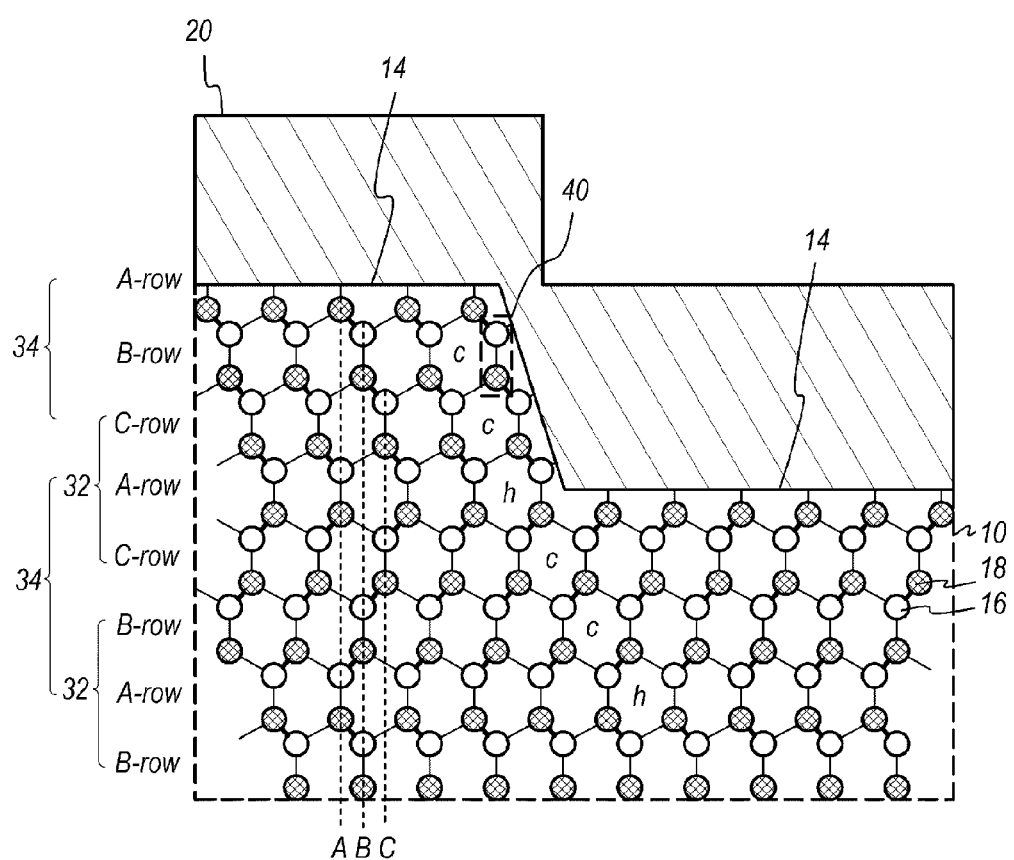
FIG. 6 schematically shows a cross section of an SiC structure having a substrate of 6H-SiC type whose surface exposes an fcc surface, which is according to the first embodiment of the present invention.

FIG. 6 shows a cross section of the SiC structure having a 6H-SiC substrate whose surface is the fcc surface, which is according to the first embodiment of the present invention. The single crystal SiC substrate 10 arranges the sites in the order of A-B-C-A-C-B-A-B from the top surface thereof. Thus, the 6H-SiC alternately arranges two c-sites and one h-site and the steps appears in every three atomic layers. The SiC substrate has the fcc surface 14 and the film 20 is in contact with the fcc surface 14 but apart from the hcp surface 12.

Figure 7:
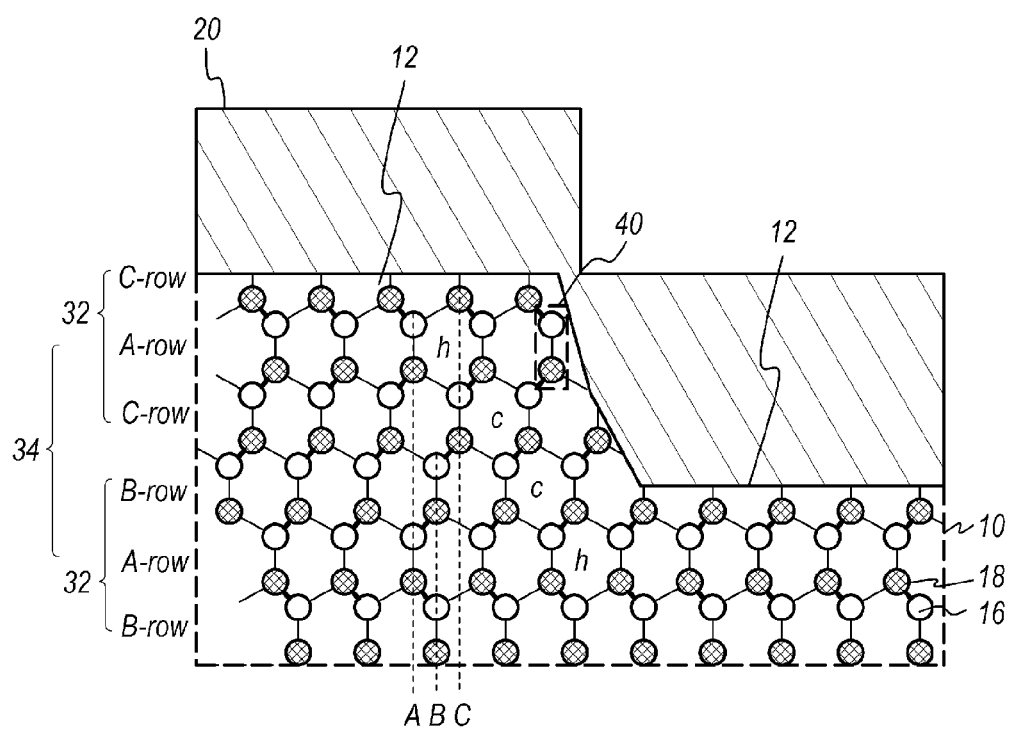
FIG. 7 schematically shows a cross section of an SiC structure having a substrate of 6H-SiC type whose surface exposes an hcp surface, which is according to the first embodiment of the present invention.

FIG. 7 shows a cross section of another SiC structure with the 6H-SiC substrate whose surface has only the hcp surface 12. As shown in FIG. 7, the steps appear in every three atomic layers. The SiC substrate 10 shows the hcp surface 12 and the film 20 is in contact with the hcp surface by apart from the fcc surface 12. Other arrangements are substantially same with those shown in FIG. 6.

Figure 8:
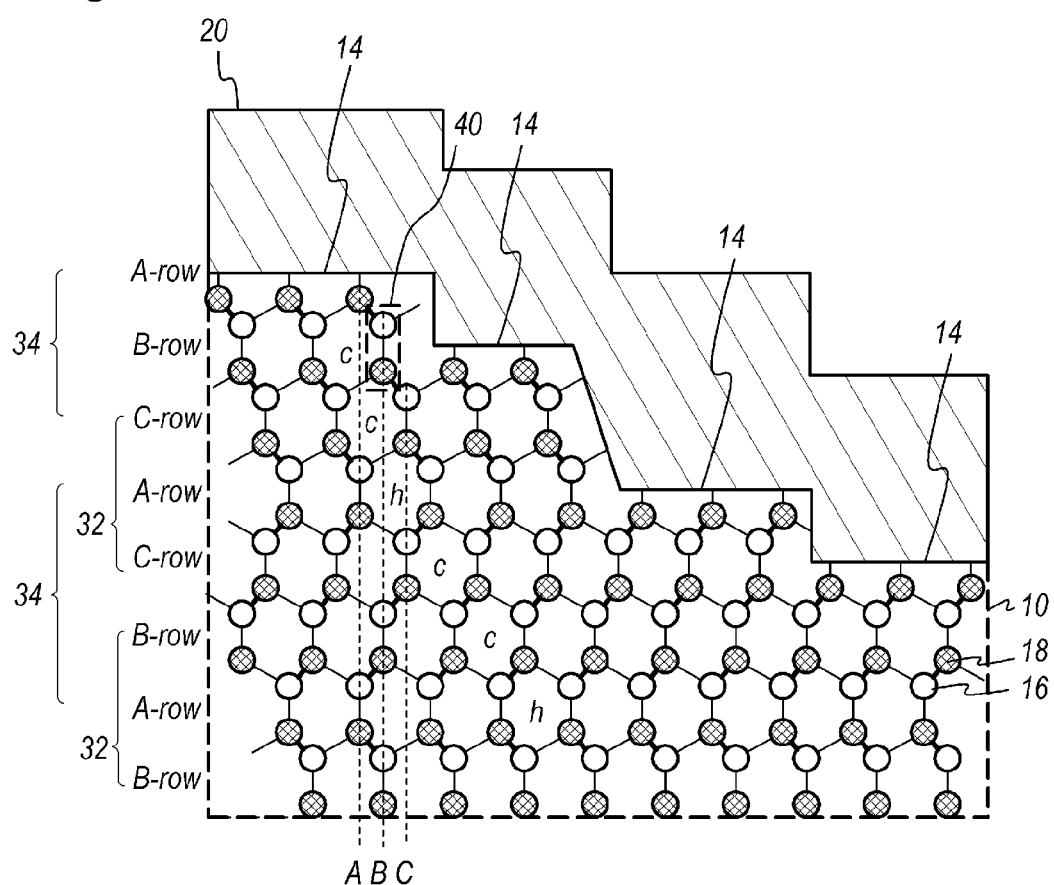
FIG. 8 schematically shows a cross section of an SiC structure having a substrate of 6H-SiC type whose surface exposes an fcc surface, which is according to the first embodiment of the present invention.

FIG. 8 shows another cross section of the SiC structure with the 6H-SiC substrate whose surface shows only the fcc surface. Steps are alternately formed in every two atomic layers and a single atomic layer. The surface of the SiC substrate 10 appears the fcc surface 14, and the film 20 is in contact with the fcc surface 14 but apart from the hcp surface 12.

As shown in FIGS. 6 and 7, by forming the steps in every three or multiples of three atomic layers, the top surface may become only one of the fcc surface 14 and the hcp surface 12. Also, as shown in FIG. 8, combining steps in every two atomic layers and a single atomic layer, the fcc surface 14 may appear in the surface of the SiC substrate 10.

The first embodiment provides the SiC single crustal substrate that includes both the fcc stack 32 and the hcp stack 34, like the 4H-SiC substrate and/or 6H-SiC substrate, and the film 20 made of material except for SiC. The surface of the SiC single crystal substrate 10, with which the film is in contact, exposes only one of the hcp surface 12 and the fcc surface 14. Accordingly, the SiC substrate 10 may make the surface electrical potential uniform. For instance, when a MOSFET is formed with a gate insulating layer made of film 20, such a surface with a uniform electrical potential distribution may suppress localized variation in a threshold voltage of the MOSFET. When the film 20 is a Schottky metal, Schottky barrier height may be controlled. Also, carrier scattering due to the electrical potential distribution in the channel of a MOSFET or in the film 20 on the SiC substrate 10, for instance, a graphene layer, may be suppressed, which means the carrier mobility increases.

The SiC single crystal layer may be the SiC single crystal substrate 10 itself or a SiC layer grown on the substrate 10. The film 20 may be a film such as those made of silicon oxide (SiO), silicon nitride (SiN), and silicon oxy-nitride (SiON), or a film primarily made of carbon or silicon, or a metal film. The film 20 also may be made of two-dimensional material such as graphene film.

As FIGS. 4 to 8 show, the surface of the SiC single crystal substrate 10 exposes the fcc surface 14 or the hcp surface 12 even through the substrate 10 has a stepped surface. Accordingly, the device formed on the substrate 10 may use the 4H-SiC substrate or 6H-SiC substrate where those structures are easy to be produced. Also, the surface of the SiC substrate 10 may easily reproduce the type of the surfaces without being bound the various phases of the SiC single crystal.

A surface at least 90% thereof preferably shows the fcc surface 14 or the hcp surface 12 in order to show the function according to the present invention. A surface at least 95% thereof is one of the fcc surface 14 and the hcp surface 12 is further preferable.

Second Embodiment

Figure 9A:
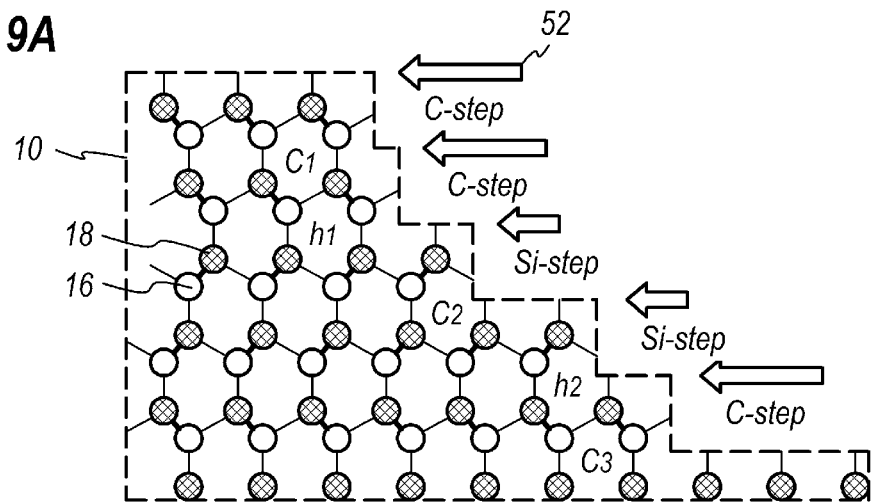
FIGS. 9A and 9B show cross sections of the SiC substrate at respective steps of the process of forming the SiC structure according to the second embodiment of the invention.
Figure 9B:
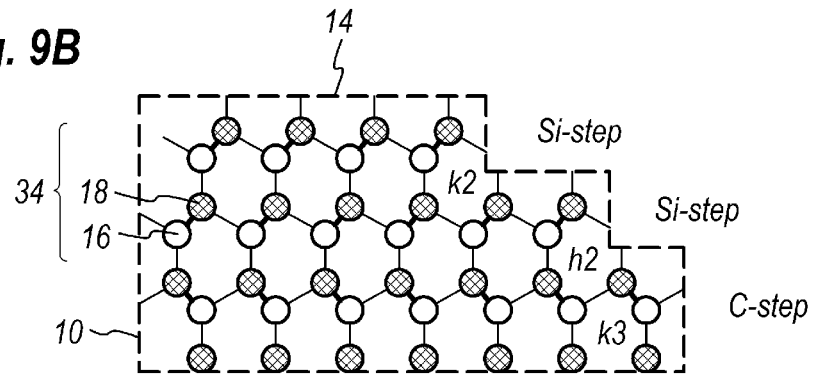

The second embodiment according to the present invention relates to a process of forming the SiC structure;

specifically, the process of forming the fcc surface 14 of the SiC substrate by etching. FIGS. 9A and 9B show cross sections of the SiC structure at respective steps of the process in the second embodiment. As FIG. 9A illustrates, The SiC substrate 10, which has the 4H-SiC structure, alternately stacks c-sites and h-sites, where they are called as, from the side of the top surface, c1, h1, c2, h2, c3, . . . , and so on. Only one dangling bond for the respective atoms appears in the surface so as to minimize the energy. In the example shown in FIG. 9A, Si atoms appear in the surface of the SiC substrate 10. Although not explicitly shown in FIGS. 9A and 9B, the back surface of the SiC substrate 10 appears C atoms. Also, when Si atoms 18 and C atoms 16 are opposite, the top surface of the substrate 10 appears C atoms.

Because the SiC substrate 10 in surface thereof is not completely flat; steps appear in the surface thereof. Sides of the steps expose carbon atoms 16 or silicon atoms 18. In FIG. 9A, the topmost step exposes carbon atom 16, which will be called as the C-step. The upper side in the first c-site c1 becomes the C-step, while, the lower one also becomes the C-step, which is the higher side of the first h-site h1. The lower side of h1 site becomes the Si-step, which is the higher one of the second c-site c2. Thus, the upper and the lower sides of the c-sites become the same type of the step, while, those of the h-sites become the types different from each other. The 4H-SiC substrate alternates two C-steps and two Si-steps.

It is known in the field that surface energy Ec of the C-step is higher than surface energy $E_{Si}$ of the Si-step. For instance, Journal of Crystal Growth published in 1984 in pages 30 to 40 of volume 70 has reported this fact. Accordingly, etching the SiC substrate 10, or exposing the surface thereof in an oxidizing atmosphere, the C-steps are primarily etched or oxidized as shown in arrows indicated in FIG. 9A. Accordingly, the C-steps approach the Si-steps and finally overlap with the Si-steps, which are often called as the step bunching. When the C-steps in the upper and lower sides of the c1-site are promptly etched, which accelerates the etching of the upper side of the h1-site, the fcc surface 14 is left on the topmost surface of the SiC substrate, as shown in FIG. 9B. This mechanism may be similarly applicable to other polytypes such as the 6H-SiC structure.

The velocity $v_{Si}$, or the etching rate, of the Si-step and that of the C-step are denoted as $v_{Si}=A\times\exp(-E_{Si}/k/T)$ and $v_C=B\times\exp(-E_C/k/T)$, respectively where A and B are constants, k is a Boltzmann constant, and T is an absolute temperature. In order to get the fcc surface 14, a ratio of the velocity vc against the velocity $v_{Si}$ is preferably larger; that is, $v_C/v_{Si}=A/B\times\exp((E_{Si}-E_C)/k/T)$ becomes larger. Accordingly, the temperature T of the process is preferably set lower. However, a lower temperature T decreases absolutes of the velocities, vc and vsi. Thus, the temperature of the process is necessary to be determined taking a process time, namely, etching time of the process.

An example to obtain the fcc surface of the SiC substrate 10 will be explained by exposing the SiC substrate 10 in hydrogen ($H_2$) atmosphere. When the temperature of the exposure exceeds 1500° C., the etching velocity vc of the C-step and that $v_{Si}$ becomes comparable. The process first prepares a 4H-SiC substrate with (0001) crystal surface as the topmost surface. This SiC substrate 10 is exposed in $H_2$ atmosphere at a temperature of 500° C. Under such a temperature, the C-step is promptly etched compared with the Si-step as shown in FIGS. 9A and 9B, but the C-step is not etched beyond the Si-step; that is, the etching of the C-step is substantially stopped when the C-step becomes aligned with the Si-step. Thus, the SiC substrate 10 forms the topmost surface thereof as the fcc surface 14. Thereafter, a film 20 is deposited on the topmost surface of the SiC substrate 10 by, for instance, a chemical vapor deposition (CVD) technique, where the film 20 may be made of silicon dioxide ($SiO_2$), graphene, and so on. Thus, an SiC structure with the film shown in FIG. 4 may be obtained.

The process described above may be similarly applicable to another SiC substrate with the 6H-SiC type. Also, the temperature for exposing $H_2$ atmosphere is preferably lower than 600° C. Oppositely, in order to shorten the process time with securing substantial etching, the process temperature is preferably higher than 300° C. The $H_2$ atmosphere may contain inactive gases of, for instance, nitrogen ($N_2$), helium (He), argon (Ar), neon (Ne), xenon (Xe), and mixtures of those gases. The $H_2$ atmosphere in a pressure thereof is not restricted to an atmospheric pressure.

Third Embodiment

Figure 10A:
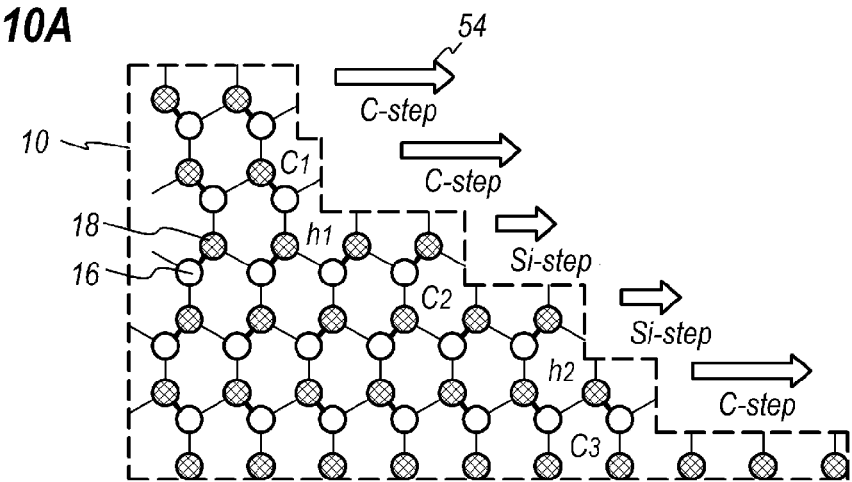
FIGS. 10A and 10B show cross sections of the SiC substrate at respective steps of the process of forming the SiC structure according to the third embodiment of the invention.
Figure 10B:
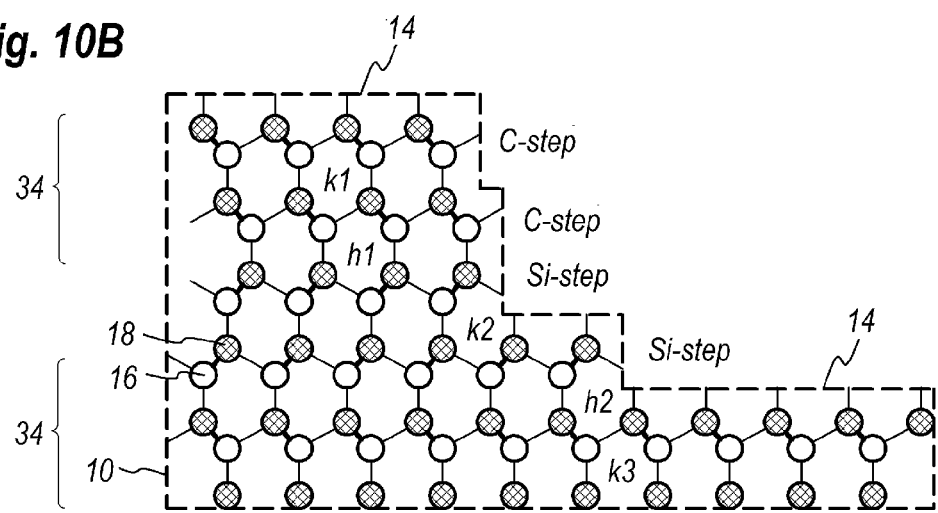

The third embodiment of the present invention relates to a process of forming the fcc surface 14 on the SiC substrate by growing the SiC. FIGS. 10A and 10B show cross sections of the process of forming the fcc surface. FIG. 10A shows, similar to those shown in FIG. 9A, the C-steps and the Si-steps in the topmost surface of the substrate 10. Because the C-step has the surface energy $E_C$ higher than that $E_{Si}$ of the Si-step, the C-steps easier grow compared with the Si-steps, as shown in arrows in FIG. 10A. Performing the epitaxial growth that controls the steps, which is disclosed in the second non-patent document, the C-steps may be promptly grown compared with the Si-steps until the C-steps become aligned with the Si-steps. As shown in FIG. 10B, the c1-site and the h1-site dominantly grow and the fcc surface 14 appears in the topmost surface of the substrate 10. This mechanism may be similarly applicable to the other polytypes such as the 6H-SiC type.

The growth velocity $r_{Si}$ of the Si-step is denoted as $r_{Si}=\alpha\times\exp(-E_{Si}/k/T)$, while, that $r_C$ of the C-step is denoted as $r_C=\beta\times\exp(-E_C/k/T)$, where $\alpha$ and $\beta$ are constants, k is the Boltzmann constant, and T is an absolute temperature. In order to obtain the fcc surface 14, a ratio of the former velocity $r_C$ against the latter one $r_{Si}$ is preferably larger, that is, $r_C/r_{Si}=\alpha/\beta\times\exp(-E_{Si}-E_C)/k/T)$ becomes larger. Similar to the aforementioned embodiment, the process temperature is preferably lowered to enhance the ratio. However, a lower process temperature T results in reduction of the absolute growth rate of the C-step and the Si-step. Also, a lower growth temperature causes inferior quality of grown layers. Accordingly, the growth temperature of the C-step is necessary to be determined taking those effects into account.

An example will be described. The process first prepares a 4H-SiC substrate whose topmost surface is inclined to the [11-20] crystal orientation from (0001) surface. Such an inclined surface causes steps in the topmost surface. Growing SiC layer on such a surface at a temperature of 1650° C. by the aforementioned step controlling epitaxy and flowing silane ($SiH_4$), propane ($C_3H_8$), and hydrogen ($H_2$) by respective flow rates of 20 sccm, 13 sccm, and 2 slm, the SiC layer is epitaxially grown on the SiC substrate 10. Because the C-step promptly grows laterally on the surface compared with the Si-step, and the lateral growth of the C-step effectively stops when it is aligned with the Si-step, the SiC substrate 10 shows the fcc surface 14 on the topmost thereof, as shown in FIG. 10B. Thereafter, the topmost surface of the SiC substrate 10 thus processed is covered with the film 20 to form the SiC structure shown in FIG. 4.

In an alternative, the process prepares a SiC substrate with a topmost surface thereof inclined by 4° toward [11-20] crystal orientation from (0001) surface thereof. Similar to the process above described, the step controlling epitaxy may grow the SiC layer so as to form the fcc surface 14 in the topmost thereof. Covering the topmost surface of the SiC substrate with the film 20, the SiC structure shown in FIG. 6 or FIG. 8 may be obtained.

The growth temperature for the SiC layer is preferably lower than 1700° C. to enhance the ratio $r_C/r_{Si}$ of the growth rates for the C-step and the Si-step, respectively. Also, from absolute growth rates thereof, the growth temperature is preferably higher than 1450° C. Flow rates of the source gases of silane ($SiH_4$) and propane ($C_3H_8$), and that of the carrier gas of hydrogen ($H_2$) may be optional.

Thus, the second embodiment and the third embodiment may form the topmost surface of the SiC single crystal substrate 10, which contains both the hexagonal close packed cells and the face centered cubic unit cells, having only one of the hcp surface 12 and the fcc surface 14. The topmost surface of the substrate 10 thus formed may appear the fcc surface 14. The topmost surface of the SiC substrate 10 becomes the Si-polar surface because of lowered surface energy of silicon (Si) compared with carbon (C). Covering this topmost surface by the film 20 so as to be in direct contact therewith, the SiC structure of the first embodiment may be obtained. The topmost surface of the film 20 becomes parallel to the topmost surface of the SiC substrate 10.

The process has an etching condition where one of the C-step and the Si-step may be promptly etched compared with the other of the C-step and the Si-step. Thus, the process may form the topmost surface of the SiC substrate 10 exposing only one of the hcp surface 12 and the fcc surface 14. The etching temperature for the SiC substrate 10 is preferably between 300 to 600° C. Also, the process has a growth condition where one of the C-step and the Si-step promptly grows compared with the other of the C-step and the Si-step, which may also form the topmost surface of the SiC substrate having only one of the hcp surface and the fcc surface.

Fourth Embodiment

The fourth embodiment according to the present invention relates to a process of forming a graphene layer on a SiC substrate. Sublimating Si on the topmost of the SiC substrate by a process disclosed in the first non-patent document, a graphene layer may be formed on the SiC substrate. Forming an odd number of graphene layers on the 4H-SiC substrate 10 whose topmost surface is the fcc surface 14, the topmost surface of the SiC substrate 10 becomes the hcp surface 12. Also, forming an even number of graphene layers on the 4H-SiC substrate 10 whose topmost surface is the fcc surface 14, the topmost surface of the SiC substrate 10 becomes the fcc surface 14. Thus, a graphene layer 20 may be formed on the SiC substrate 10 with the fcc surface 14.

The number of graphene layers depends on the sublimation of Si atoms from the SiC surface. The sublimation of Si atoms may be suppressed as the temperature becomes lower and the vapor pressure of Si becomes lower. Accordingly, precisely controlled temperature and the Si vapor pressure in atmosphere may form a mono layer or double layers of the graphene on the SiC substrate 10. Forming the mono layer of the graphene on the 4H-SiC substrate 10 with the fcc surface 14, the graphene in contact with the hcp surface 12 may be obtained; while, forming the double layer of the graphene on the 4H-SiC substrate 10 with the fcc surface 14, the graphene in contact with the fcc surface 14 may be obtained. Thus, the carrier mobility within the graphene increases because of a uniform distribution of the electrical field within the SiC substrate 10. Also, the graphene may enhance the quality thereof.

Such a graphene may be obtained by exposing the SiC substrate 10 at a temperature of 1600° C. within argon (Ar) atmosphere; that is, the sublimation of Si atoms may be carried out at the temperature of 1600° C. Temperatures from 1600 to 1800° C. may be applicable for forming the graphene. Also, the sublimation may be carried out within an atmosphere of, not only Ar, but nitrogen ($N_2$), and other noble and inactive gases, or within a vacuum.

A graphene formed by the sublimation of Si atoms may enhance the layer quality, or may reduce defected induced within the formed graphene. Also, the formed graphene is in contact with only one of the hcp surface 12 and the fcc surface 14 of the SiC substrate 10, which makes the surface distribution of the electrical field homogeneous in the SiC substrate 10 and enhances the carrier mobility in the graphene.

Fifth Embodiment

Figure 11A:
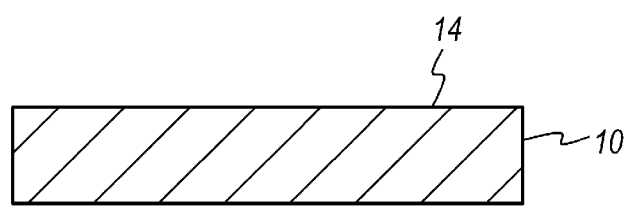
FIGS. 11A to 11D show cross sections of the SiC structure at respective steps of forming thereof according to the fifth embodiment of the invention.
Figure 11B:
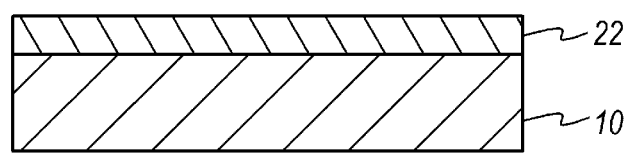
Figure 11C:
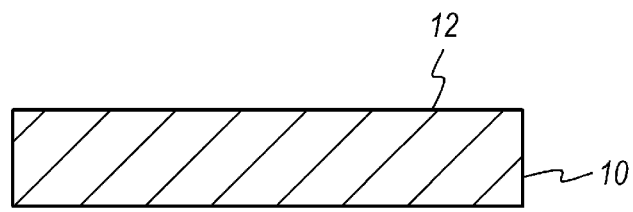
Figure 11D:
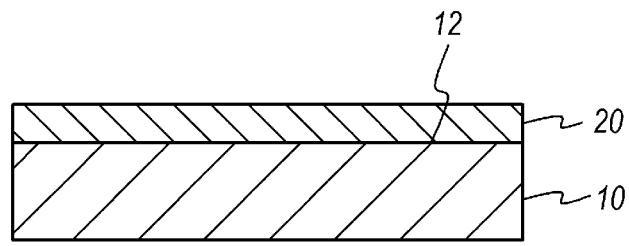

The fifth embodiment according to the present invention relates to a process of forming a film on the hcp surface of the SiC substrate 10. FIGS. 11A to 11D shows cross sections of the structure at respective steps of the process. The process first forms the fcc surface 14 of the 4H-SiC substrate 10 by techniques of the second or the third embodiment. Sublimating Si atoms on the surface of the SiC substrate 10, the graphene layer 22, which has an odd number of layers, is formed on the surface of the SiC substrate 10 as shown in FIG. 11B. Removing the graphene layer 22 thus formed by oxidizing or cleaving so as to leave the hcp surface 12 on the SiC substrate 10, as shown in FIG. 11C. Forming the film 20 on thus formed topmost surface of the SiC substrate 10 as shown in FIG. 11D, the film 20 may be formed on the hcp surface 12 of the substrate.

Sixth Embodiment

Figure 12:
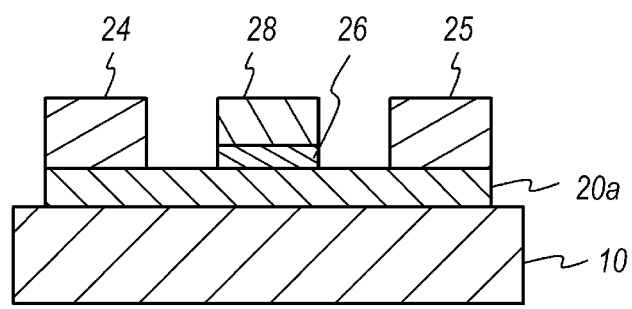
FIG. 12 shows a cross section of a semiconductor device according to the sixth embodiment of the invention.

The sixth embodiment according to the present invention relates to a semiconductor device. FIG. 12 shows a cross section of the semiconductor device of the present embodiment, where the semiconductor device provides a graphene layer 20a on the SiC substrate 10. The graphene layer 20a may be formed by, for instance, the process of the fourth embodiment. The graphene layer 20a provides source and drain electrodes, 24 and 25, as the ohmic electrode, and a gate electrode 28 between the source and drain electrodes, 24 and 25, via an insulating film 26. The source and drain electrodes, 24 and 25, may be made of nickel (Ni), or stacked metals of nickel (Ni) and gold (Au) on the nickel (Ni). The insulating film 26, which may be a gate insulating film, may be made of aluminum oxide (AlO), or aluminum oxide accompanied with silicon oxide (Si) thereon. The gate electrode 28 may be made of stacked metals of titanium (Ti) and gold (Au).

The topmost layer of the SiC substrate that is in direct contact with the graphene layer 20a is formed by only one of the hcp surface 12 and the fcc surface 14. Thus, the carrier mobility of electrons and/or holes within the graphene layer 20a may be enhanced.

In an alternative, an electronic device implementing the SiC substrate 10 may be a type of MOSFET having a gate insulating film made of film 20 on the SiC substrate 10, which involves the SiC structure of the first embodiment of the present invention. When the film 20 plays a role of the gate insulating film, the channel formed beneath the film 20 may enhance the carrier mobility thereof and the MOSFET with the film 20 as the gate insulating film may suppress local variations in the threshold voltage thereof. On the other hand, when the film 20 is a type of Schottky metal, the barrier height of the Schottky metal may be uniform.

EXAMPLE

Figure 13A:
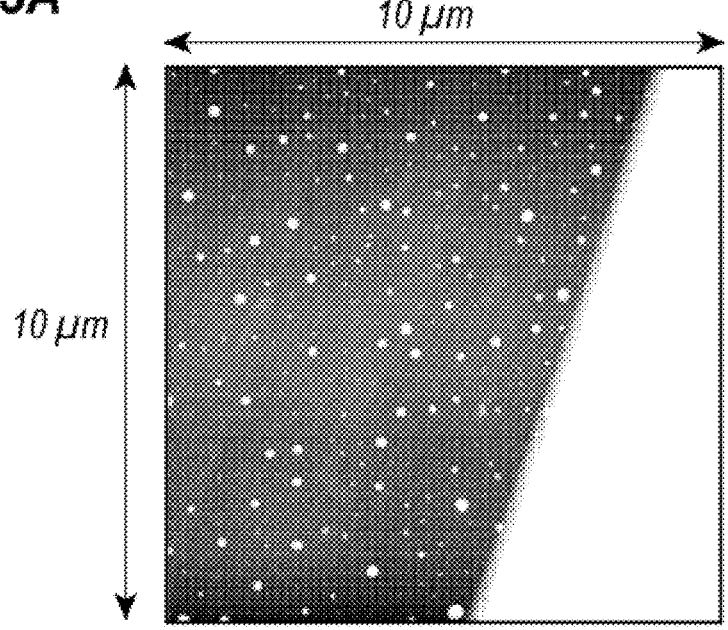
FIGS. 13A and 13B show images of the atomic force microscope (AFM) for samples without hydrogen ($H_2$) treatment and with $H_2$ treatment, respectively.
Figure 13B:
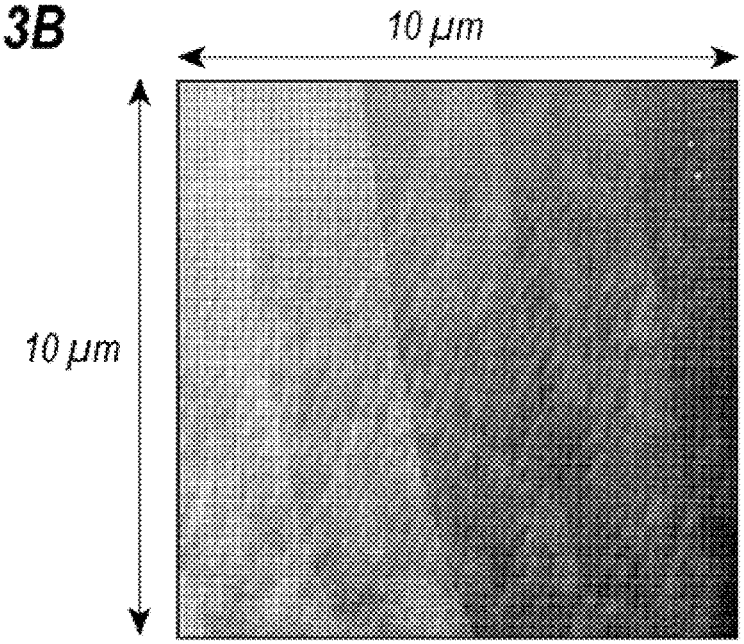

An example of obtaining an SiC substrate having only one type, the fcc surface or the hcp surface, but accompanied with substantial steps will be described. An SiC substrate with the 4H-SiC type, where the SiC substrate had the Si-polar surface, was first treated in hydrogen ($H_2$) under conditions of: within a pure hydrogen ($H_2$) without any noble or inert gases at an atmospheric pressure, a temperature of 500° C., and a period of 300 minutes. A surface of the sample was compared before and after the hydrogen ($H_2$) treatment by the atomic force microscope (AFM). FIGS. 13A and 13B compare the sample before and after the treatment. Images shown in FIGS. 13A and 13B are within a range of 10 μm square. The sample before the treatment shows no steps in an atomic scale. The average surface roughness Ra, which is an average of squares of unevenness within a preset length, was 11.48 nm.

Although the surface after the treatment, as shown in FIG. 13B, caused steps in the atomic scale; average roughness of the surface of the SiC substrate 10 was 0.416 nm. The steps had a height of about 1 nm, which corresponded to a length of two bonds between Si and C atoms in the (0001) crystal plane. Accordingly, the surface of the SiC substrate 10 had only one of the hcp surface 12 and the fcc surface 14. Because the steps ran substantially parallel to each other, the steps were seemed to be the Si step because of lower surface energy. Thus, the SiC substrate 10 thus treated within the hydrogen ($H_2$) had only the fcc surface 14.

Next, a graphene was formed on the SiC substrates one of which was not treated in hydrogen ($H_2$), while, the other was treated in hydrogen ($H_2$). The graphene was formed by exposing the SiC substrates in conditions of: argon (Ar) atmosphere in an atmospheric pressure, a temperature of 1600° C., and a period of 10 minutes. The Raman spectroscopy took two peeks, one of which was the G-band around 1590 $cm^{-1}$, while, the other was the D-band around 1350 $cm^{-1}$, where the former peak is due to the sp2 bond of carbon (C) atoms forming the six-membered ring, while, the latter corresponds to a case when the six-membered ring forms a dangling bond, namely, the imperfect six-membered ring. When a ratio of the latter peak against the former peak D/G increases, defects involved in the graphene become larger.

FIGS. 14A and 14B are two dimensional mapping within 500 μm square of the ratio D/G for the sample without the hydrogen ($H_2$) treatment and with the treatment, respectively. As the scale in the side of the mappings indicates, a darker area corresponds to a smaller ratio, while, a lighter area corresponds to a larger ratio. The sample without the hydrogen ($H_2$) treatment indicated lighter area, namely, larger ratios with an average of 86.3%. On the other hand, the sample with the hydrogen ($H_2$) treatment indicated darker areas with an average of 41.7%. Thus, the sample with the hydrogen ($H_2$) treatment decreases defects in the graphene, which is due to the uniformity of the close packed structure in the surface of the SiC substrate 10 and accordingly, the growth rate and/or the orientation of the growth become homogeneous within the surface of the SiC substrate.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application 2016-172296, filed on Sep. 2, 2016, which is incorporated herein by reference.

What is claimed is:

1. A silicon carbide (SiC) structure, comprising;
a SiC single crystal substrate including both of a hexagonal close packed (hcp) structure and a face centered cubic (fcc) structure; and
a film provided on the SiC single crystal substrate,
wherein the SiC single crystal substrate has a surface that exposes only one of an hcp surface and a fcc surface, the hcp surface having atoms in a topmost layer whose rows overlap with rows of atoms in a third layer, and the fcc surface having atoms in the topmost layer whose rows are different from rows of atoms in the third layer.

2. The SiC structure of claim 1,
wherein the surface of the SiC single crystal substrate has steps on which Si atoms are exposed.

3. The SiC structure of claim 1,
wherein the film is made of graphene.

4. The SiC structure of claim 1,
wherein the surface of the SiC substrate has a Si-polar surface that exposes Si atoms.

5. A semiconductor device, comprising:
a SiC structure including a SiC single crystal substrate having both a hexagonal close packed (hcp) structure and a face centered cubic (fcc) structure, and a surface that exposes only one of an hcp surface and an fcc surface, the hcp surface having atoms in a topmost layer whose rows overlap with of atoms in a third layer, and the fcc surface having atoms in the topmost layer whose rows are different from rows of atoms in the third layer;
a film provided on the SiC single crystal substrate;
ohmic electrodes provided on the film; and
a gate electrode provided on the film and between the ohmic electrodes.

* * * * *